(12) United States Patent
Hollis

(10) Patent No.: US 7,148,690 B2
(45) Date of Patent: Dec. 12, 2006

(54) SYSTEMS, METHODS AND APPARATUS FOR INDUCING ELECTROMAGNETIC MUTUAL INDUCTANCE IN MAGNETIC COILS TO REDUCE INHOMOGENEITY IN A MAGNETIC FIELD OF THE MAGNETIC COILS

(75) Inventor: Timothy James Hollis, Bicester (GB)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/070,012

(22) Filed: Mar. 2, 2005

(65) Prior Publication Data

US 2006/0197531 A1    Sep. 7, 2006

(51) Int. Cl.
*G01V 3/00*    (2006.01)

(52) U.S. Cl. ...................................... 324/320; 324/319

(58) Field of Classification Search ................ 324/320, 324/319; 335/301, 299
See application file for complete search history.

(56) References Cited

U.S. PATENT DOCUMENTS

| | | | | |
|---|---|---|---|---|
| 4,812,797 A | * | 3/1989 | Jayakumar | .................. 335/299 |
| 6,400,154 B1 | * | 6/2002 | Tomanek et al. | ........... 324/318 |
| 6,507,259 B1 | * | 1/2003 | Westphal et al. | ........... 335/301 |
| 6,727,699 B1 | * | 4/2004 | Kasten | ....................... 324/318 |
| 2002/0101240 A1 | | 8/2002 | Kasten | |

\* cited by examiner

*Primary Examiner*—Louis M. Arana
(74) *Attorney, Agent, or Firm*—Carl Horton; Peter Vogel; Michael Smith

(57) ABSTRACT

Systems, methods and apparatus are provided through which inhomogeneity in a magnetic field is reduced by invoking electromagnetic mutual inductance between a main coil and another coil.

21 Claims, 10 Drawing Sheets

SYSTEMS, METHODS AND APPARATUS FOR INDUCING ELECTROMAGNETIC MUTUAL INDUCTANCE IN MAGNETIC COILS TO REDUCE INHOMOGENEITY IN A MAGNETIC FIELD OF THE MAGNETIC COILS

FIELD OF THE INVENTION

This invention relates generally to generating magnetic fields, and more particularly to modifying generated magnetic fields.

BACKGROUND OF THE INVENTION

Magnetic resonance imaging (MRI) systems use a magnetic field to sense the structure of an object. The structure creates perturbations and variations in the strength of the magnetic field. The perturbations and variations in the strength of the magnetic field are sensed and interpreted to provide an image of the structure of the object. In many MRI systems, the magnetic field is generated by a superconducting magnet to provide a strong magnetic field.

For a preponderance of superconducting MRI systems, it is necessary to obtain an extremely uniform field in a defined volume because interpreting of the magnetic field assumes a magnetic field of uniform strength. Uniformity is also known as homogeneity. Configuring a plurality of coils which collectively produce an extremely uniform field is possible, but unfortunately when magnets are constructed, manufacturing tolerances introduce minor perturbations in the actual coil dimensions, causing a reduction in the actual homogeneity. In addition, environmental effects such as structural steel in the magnet room can influence the homogeneity.

Overall field homogeneity can be quantified in a number of different ways. The simplest method is to determine the peak to peak variation; the span of a set of points usually plotted over the surface of a sphere. Alternative definitions are surface RMS or volume RMS; the RMS value of a set of points plotted over the surface of a sphere or the RMS value of a set of points plotted (or projected) over the volume of a sphere. The latter produces a figure typically a factor of ten smaller than the peak to peak value.

To further quantify the homogeneity, the variation of the central field of the magnet is usually expressed as a sum of Legendre polynomials and associated Legendre polynomials in a co-ordinate system at which the origin is at the magnet center. The expansion expressed in spherical co-ordinates is shown in Table 1 below:

TABLE 1

$$H(r, \theta, \phi) = \sum_{n=0}^{\infty} \sum_{m=0}^{m=n} r^n P_n^m(\cos\theta) \left[ A_n^m \cos(m\phi) + B_n^m \sin(m\phi) \right]$$

In table 1, the functions $P_n^m(\cos\theta)$ are known as Associated Legendre polynomials. $A_n^m$ and $B_n^m$ are constants which define the field variation. This is a convenient method of specifying the field variation because reasonably accurate approximations to Legendre polynomials can be produced easily with a series of circular arcs which can be connected together to form a set of correction coils (also referred to as shim coils). A magnet will often be manufactured with several correction coils, where each correction channel is identified by a particular shape of a magnetic field that each correction channel produces.

One conventional means to improve homogeneity of the magnetic field is room temperature correction coils. Room temperature shims are usually manufactured from copper wire and located within the bore of the magnet. However, the extent of capability of room temperature shims to effect homogeneity of the magnetic field is limited. Therefore room temperature shims are usually used to make fine adjustments such as correction of patient susceptibility effects only.

Another conventional means to improve homogeneity of the magnetic field is superconducting correction coils. Superconducting correction coils are secondary coils requiring low temperature for operation and are therefore typically located inside the cryogen reservoir. Although superconducting correction coils are probably the most effective conventional means to improve homogeneity of the magnetic field, superconducting correction coils are also by far the most complex to manufacture. Superconducting correction coils are also susceptible to experiencing large induced currents during a magnet quench. Also, being located within a helium vessel, the superconducting correction coils are totally inaccessible and very difficult to repair. Furthermore, setting currents of the superconducting correction coils requires a high level of technician skill and sophisticated equipment.

Another conventional means to improve homogeneity of the magnetic field is passive shims. Passive shims are usually the least expensive conventional means to improve homogeneity. Passive shims also require a lower level of skill for adjustment among the conventional means to improve homogeneity. However, very large amounts of magnetic material are required to quell large homogeneity perturbations and the large mass of ferrous material can affect performance because of temperature effects of passive shims and white pixels that the passive shims cause. Furthermore, the magnetization of passive shims often makes installation of the passive shims difficult while the primary magnet is energized. Passive shims are also problematic because the passive shims occupy space within the bore of the MRI system and the passive shims require high tray insertion forces. Some manufacturers prefer to avoid passive shims or reduce the quantity of shims by using the passive shims in conjunction with superconducting correction coils.

For the reasons stated above, and for other reasons stated below which will become apparent to those skilled in the art upon reading and understanding the present specification, there is a need in the art to improve homogeneity in a magnetic field beyond fine adjustments, that is not very complex to manufacture, install and maintain, that is does not require a large amount of magnetic material.

BRIEF DESCRIPTION OF THE INVENTION

The above-mentioned shortcomings, disadvantages and problems are addressed herein, which will be understood by reading and studying the following specification.

In one aspect, an apparatus includes a primary coil operable to generate the magnetic field and a secondary coil that is positioned in relation to the primary coil to induce electromagnetic mutual inductance with the primary coil to the extent that homogeneity in the magnetic field is increased. Without large amounts of magnetic material or significant complexity in the manufacturing, installation and maintenance of the apparatus, inhomogeneity in the magnetic field is reduced by more than mere fine adjustments in the magnetic field.

In another aspect, the secondary coil is positioned within a radius of the primary coil.

In yet another aspect, the secondary coil is positioned outside a radius of the primary coil.

In still another aspect, the secondary coil is positioned outside a radius of the primary coil and another secondary coil is positioned within a radius of the primary coil.

In a further aspect, the secondary coil is positioned outside a radius of the primary coil, another secondary coil is positioned within a radius of the primary coil and the secondary coil and the other secondary are wired together in a single circuit.

In yet a further aspect, the secondary coil is not coupled to a power supply, the secondary coil accumulates current via electromagnetic mutual inductance as the primary coil is energized and the secondary coil is energized entirely by the electromagnetic mutual inductance with the primary coil.

Systems, apparatus and methods are-described herein. In addition to the aspects and advantages described in this summary, further aspects and advantages will become apparent by reference to the drawings and by reading the detailed description that follows.

DETAILED DESCRIPTION OF THE INVENTION

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The detailed description is divided into four sections. In the first section, a system level overview is described. In the second section, apparatus of embodiments are described. In the third section, a method of an embodiment is described. Finally, in the fourth section, a conclusion of the detailed description is provided.

System Level Overview

Figure 1:
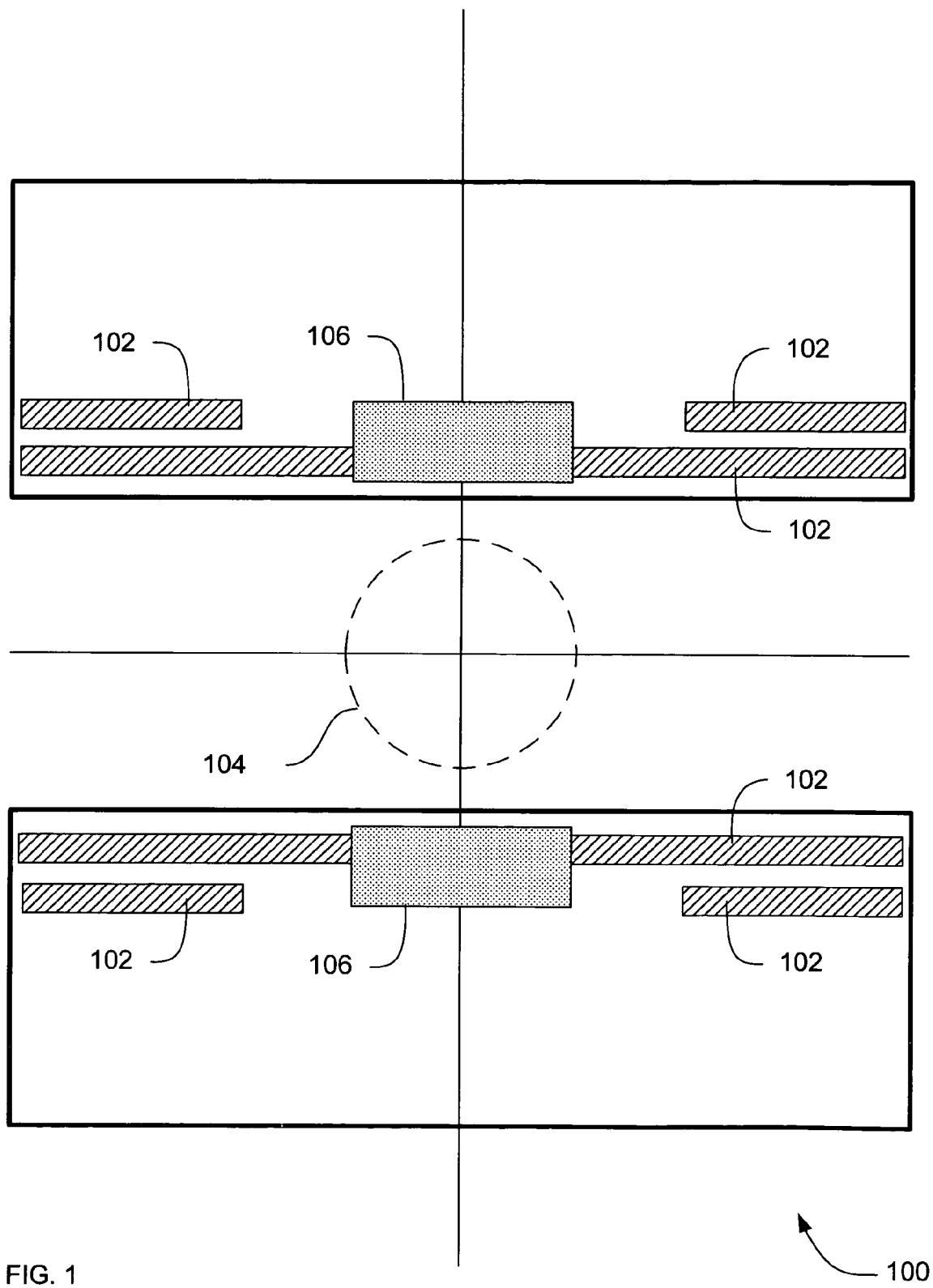
FIG. 1 is a cross section block diagram that provides an overview of a system to increase homogeneity in a magnetic field.

FIG. 1 is a cross section block diagram that provides an overview of a system 100 to increase homogeneity in a magnetic field. System 100 solves the need in the art to improve homogeneity in a magnetic field beyond fine adjustments, while not requiring complexity installation, installation and maintenance of the system, or requiring a large amount of magnetic material in the system.

System 100 includes, the apparatus includes a primary coil 102 operable to generate the magnetic field 104.

System 100 also includes a secondary coil 106 operable to induce electromagnetic mutual inductance with the primary coil 102 to the extent that homogeneity in the magnetic field 104 is increased. Instead, the secondary coil 106 accumulates current via electromagnetic mutual inductance as the primary coil 102 is energized. The secondary coil 106 is energized entirely by inductance from the primary coil 102. The secondary coil 106 can be referred to as a self-energizing coil because the secondary coil 106 is not coupled to a power supply.

The secondary coil 106 reacts to an emerging type of homogeneity anomaly, as the primary coil 102 is energized, and simultaneously produces electromagnetic harmonics to reduce the homogeneity anomaly. The secondary coil 106 reduces homogeneity anomalies in the magnetic field 104 to a significant extent beyond fine adjustments in the homogeneity. The secondary coil 106 is not very complex to manufacture, install and maintain, and the secondary coil 106 is does not require a large amount of magnetic material.

In some embodiments, the ability to induce electromagnetic mutual inductance with the primary coil 102 is achieved by positioning the secondary coil within a distance of the primary coil that will induce electromagnetic mutual inductance with the primary coil 102. In some embodiments, shown in FIGS. 2, 3, and 4, the secondary coil 106 is a plurality of coils wired in a closed loop circuit configuration.

In some embodiments, the superconducting shim coils are wound onto their own former which can extend along the whole length of the magnet. Various embodiments of the primary coil 120 include nuclear magnetic resonance (NMR) spectrometers and Fourier transform mass spectrometers (FTMS).

The system level overview of the operation of an embodiment is described in this section of the detailed description. While the system 100 is not limited to any particular primary coil 102, magnetic field 104 and secondary coil 106, for sake of clarity a simplified particular primary coil 102, magnetic field 104 and secondary coil 106 are described.

Apparatus Embodiments

In the previous section, a system level overview of an embodiment is described. In this section, the particular apparatus of such an embodiment are described by reference to a series of diagrams.

Figure 2:
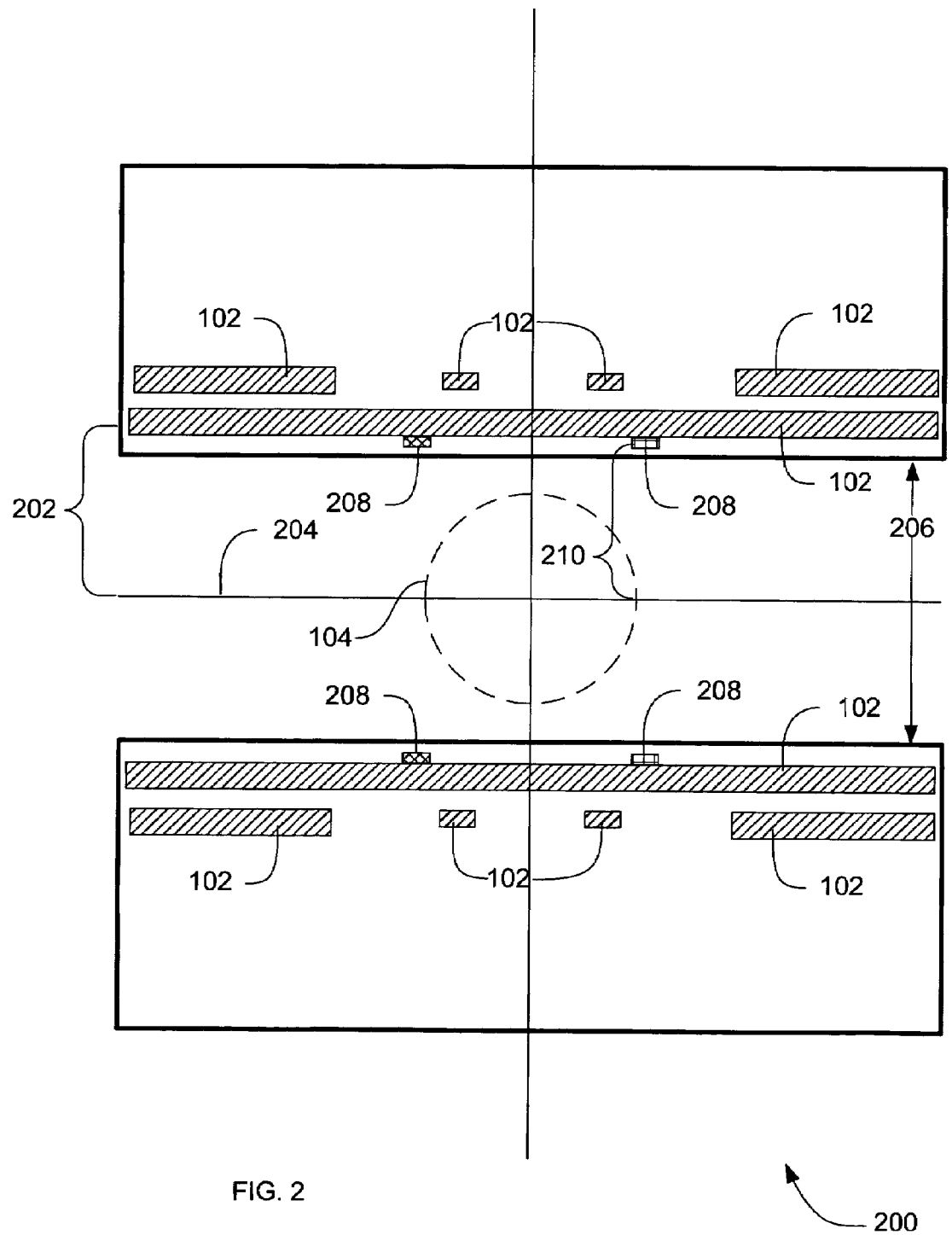
FIG. 2 is a cross section block diagram of an apparatus to increase homogeneity in a magnetic field according to an embodiment having a secondary coil positioned close to the bore.

FIG. 2 is a cross section block diagram of an apparatus 200 to increase homogeneity in a magnetic field according to an embodiment having a Z1 secondary coil positioned close to the bore. Apparatus 200 is one embodiment of system 100.

In apparatus 200, the primary coil has a radius 202 that is measured from a longitudinal axis 204 of an inner bore 206. A Z1 secondary coil 208 is positioned within the radius 202 of the primary coil 102. The Z1 secondary coil 208 has a radius 210 that is less than the radius 202 of the primary coil. The Z1 secondary coil 208 of apparatus 200 is not very complex to manufacture, install or maintain, and does not require a large amount of magnetic material. The Z1 secondary coil 208 of apparatus 200 also improves homogeneity in a magnetic field 104 more than mere fine adjustments in homogeneity.

Implementation with a Z1 shaped coil is one implementation of system 100 and apparatus 200 above and apparatus 300, 400, 500, 600, 700 and 800 and methods 900 and 1000 below. In other embodiments, secondary coils other than a Z1 coil are implemented with, for example, shapes according to the Cartesian relationships described in Table 2 below:

TABLE 2

| Coil | Order n | Degree m | Function |
|---|---|---|---|
| Z1 | 1 | 0 | z |
| Z2 | 2 | 0 | $z^2 - 0.5 p^2$ |
| Z3 | 3 | 0 | $z^3 - 1.5 p^2 z$ |
| Z4 | 4 | 0 | $z^4 - 3p^2z^2 + 0.375p^4$ |
| X | 1 | 1 | x |
| Y | 1 | 1 | y |
| ZX | 2 | 1 | 3zx |
| ZY | 2 | 1 | 3zy |
| X2 − Y2 | 2 | 2 | $3(x^2 - y^2)$ |
| XY | 2 | 2 | 3(2xy) |
| Z2X | 3 | 1 | $6(z^2 - 0.25p^2)x$ |
| Z2Y | 3 | 1 | $6(z^2 - 0.25p^2)y$ |
| Z(X2 − Y2) | 3 | 2 | $15z(x^2 - y^2)$ |
| ZXY | 3 | 2 | 15z(2xy) |
| X3 | 3 | 3 | $15(x^3 - 3xy^2)$ |
| Y3 | 3 | 3 | $15(y^3 - 3yx^2)$ |

Figure 3:
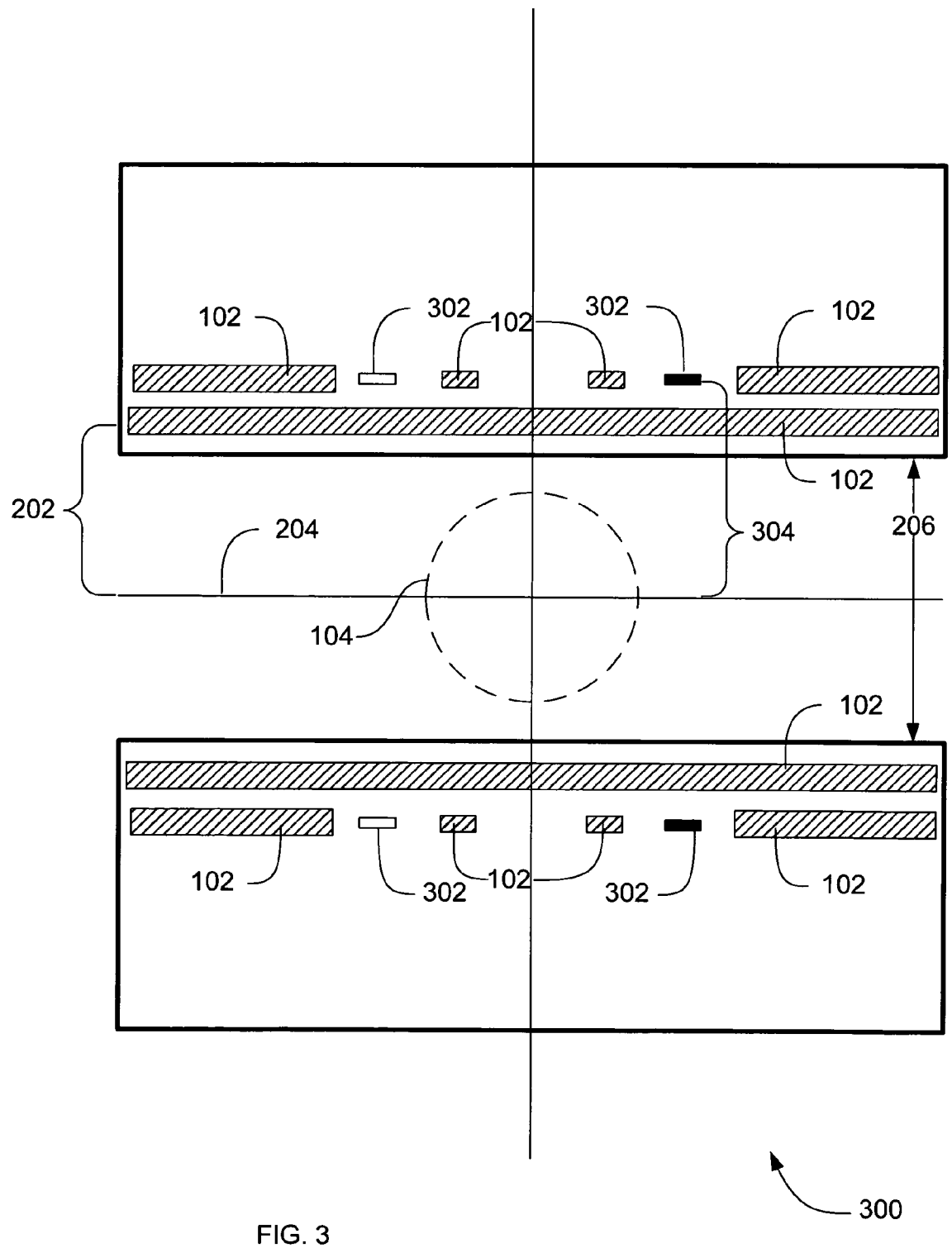
FIG. 3 is a cross section block diagram of an apparatus to increase homogeneity in a magnetic field according to an embodiment having a secondary coil positioned away from the bore.

FIG. 3 is a cross section block diagram of an apparatus 300 to increase homogeneity in a magnetic field according to an embodiment having a Z1 secondary coil positioned away from the bore.

In apparatus 300, the primary coil has a radius 202 that is measured from a longitudinal axis 204 of an inner bore 206. A Z1 secondary coil 302 is positioned outside the radius 202 of the primary coil 102. The Z1 secondary coil 302 has a radius 304 that is greater than the radius 202 of the primary coil. The Z1 secondary coil 302 of apparatus 300 improves homogeneity in the magnetic field 104 more than fine adjustments in homogeneity. The Z1 secondary coil 302 of apparatus 300 also is not very complex to manufacture, install or maintain, and does not require a large amount of magnetic material.

Figure 4:
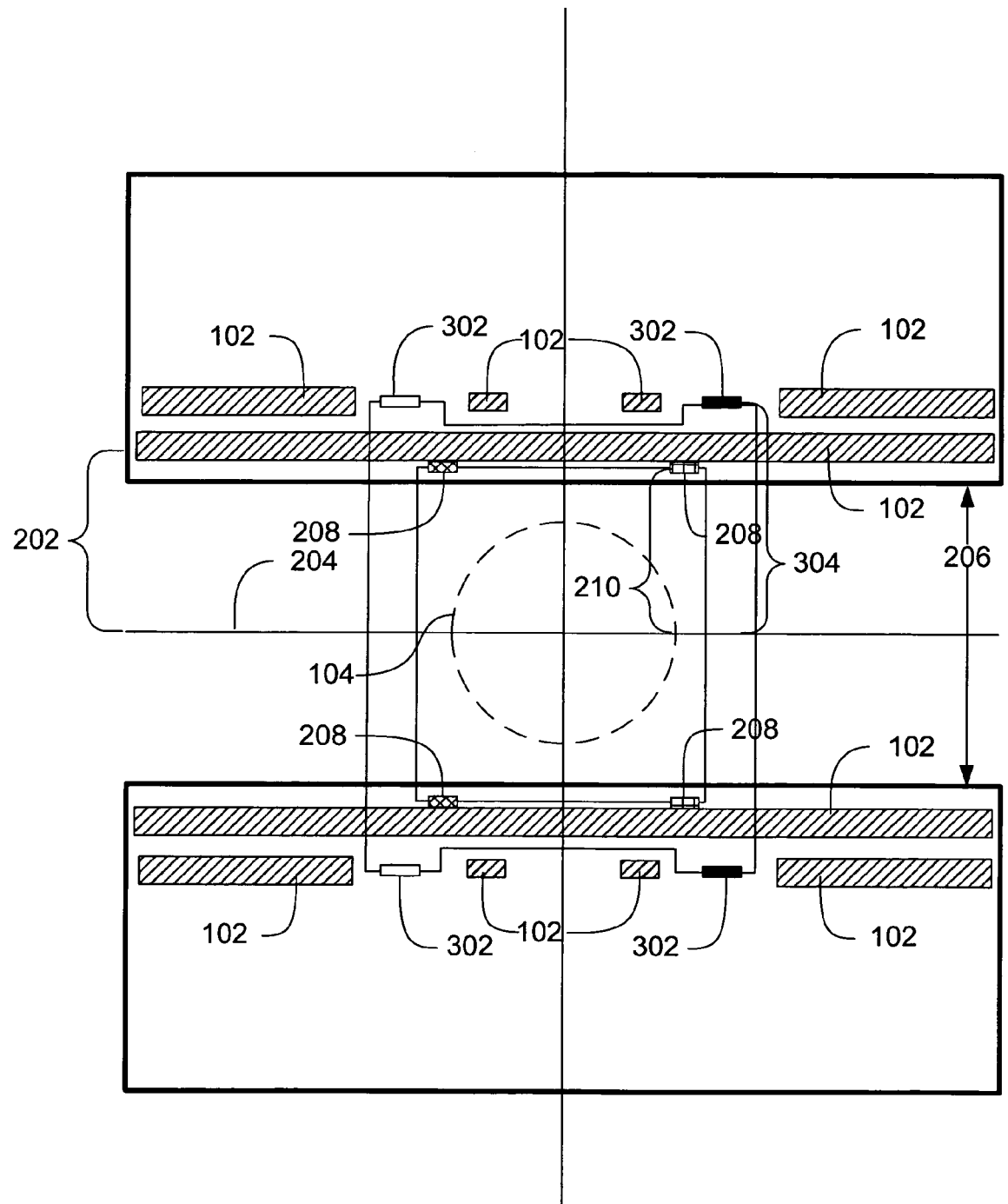
FIG. 4 is a cross section block diagram of an apparatus to increase homogeneity in a magnetic field according to an embodiment having secondary coils positioned on two radius in which each secondary coil is wired as a separate circuit.

FIG. 4 is a cross section block diagram of an apparatus 400 to increase homogeneity in a magnetic field according to an embodiment having Z1 secondary coils positioned on two radii in which each Z1 secondary coil is wired as a separate circuit.

In apparatus 400, the primary coil has a radius 202 that is measured from a longitudinal axis 204 of an inner bore 206. A Z1 secondary coil 208 is positioned within the radius 202 of the primary coil 102. The Z1 secondary coil 208 has a radius 210 that is less than the radius 202 of the primary coil. Furthermore, another Z1 secondary coil 302 is positioned outside the radius 202 of the primary coil 102. The other Z1 secondary coil 302 has a radius 304 that is greater than the radius 202 of the primary coil. The Z1 secondary coil 208 of apparatus 400 is not very complex to manufacture, install or maintain, and does not require a large amount of magnetic material. The Z1 secondary coil 208 and the other Z1 secondary coil 302 of apparatus 400 also improves homogeneity in a magnetic field 104 more than fine adjustments in homogeneity.

In apparatus 400, the Z1 secondary coil 208 is wired separately as a separate circuit from the other Z1 secondary coil 302.

Figure 5:
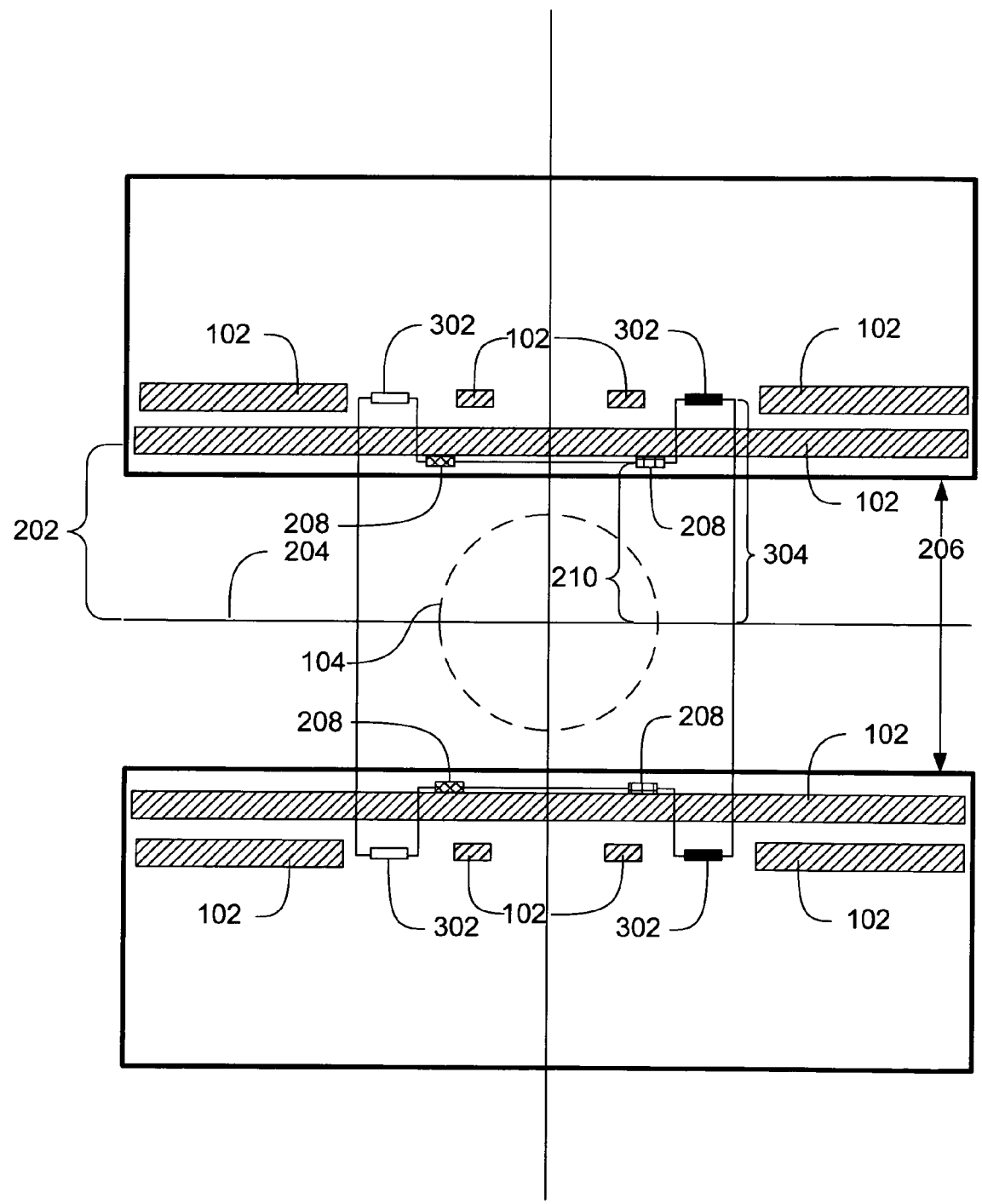
FIG. 5 is a cross section block diagram of an apparatus to increase homogeneity in a magnetic field according to an embodiment having secondary coils positioned on two radii in which each secondary coil is wired as a single circuit.

FIG. 5 is a cross section block diagram of an apparatus 500 to increase homogeneity in a magnetic field according to an embodiment having Z1 secondary coils positioned on two radii in which each Z1 secondary coil is wired as a single circuit.

In apparatus 500, the primary coil has a radius 202 that is measured from a longitudinal axis 204 of an inner bore 206. A Z1 secondary coil 208 is positioned within the radius 202 of the primary coil 102. The Z1 secondary coil 208 has a radius 210 that is less than the radius 202 of the primary coil. Furthermore, another Z1 secondary coil 302 is positioned outside the radius 202 of the primary coil 102. The other Z1 secondary coil 302 has a radius 304 that is greater than the radius 202 of the primary coil.

In apparatus 500, the Z1 secondary coil 208 is wired as a single circuit with the other Z1 secondary coil 302. The Z1 secondary coil 208 of apparatus 500 is not very complex to manufacture, install or maintain, and does not require a large amount of magnetic material. The Z1 secondary coil 208 and the other Z1 secondary coil 302 of apparatus 500 also improves homogeneity in a magnetic field 104 more than fine adjustments in homogeneity.

Figure 6:
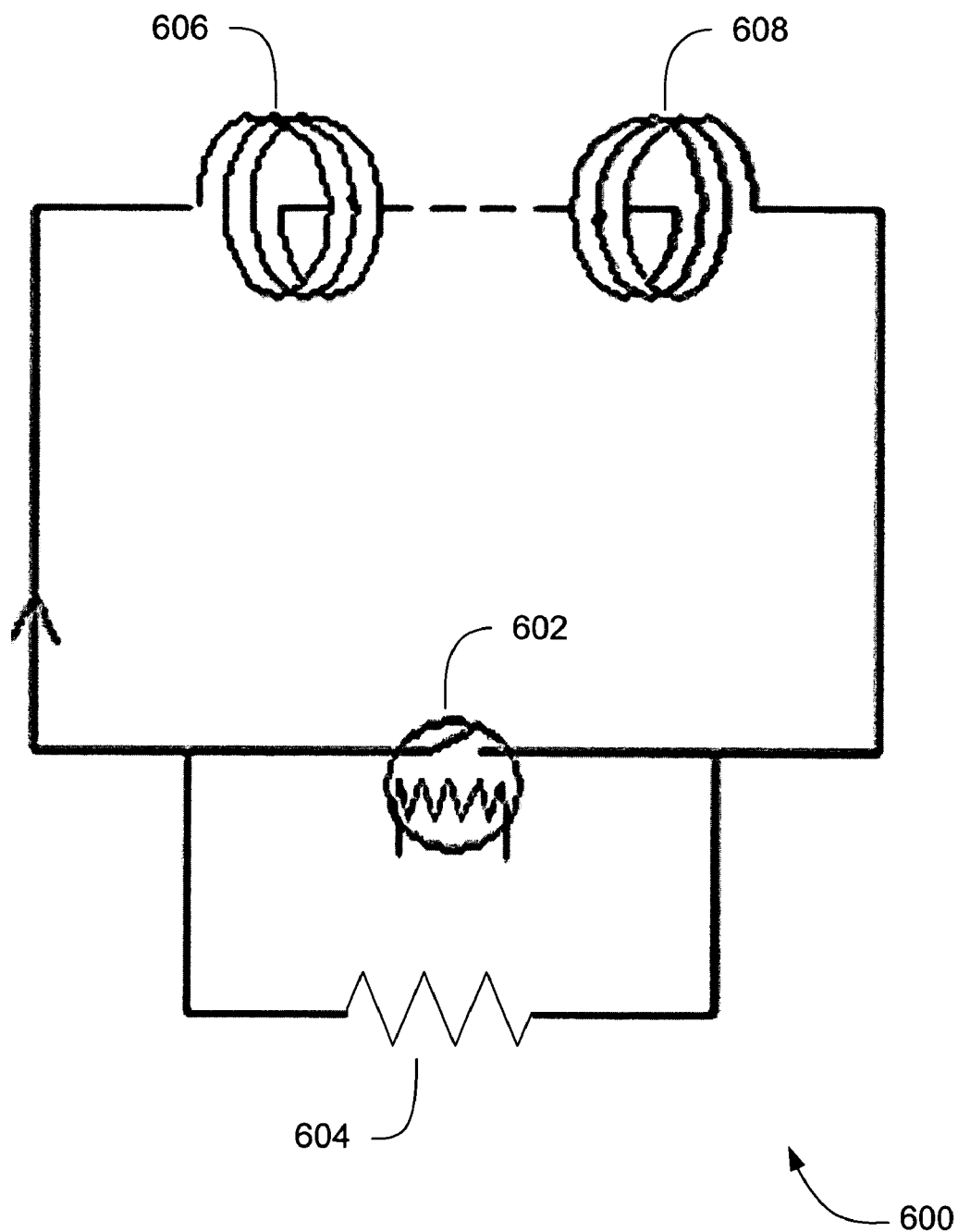
FIG. 6 is a diagram of prior art apparatus that includes a superconducting correction coil switch.

FIG. 6 is a diagram of prior art apparatus 600 that includes a superconducting correction coil switch. It should be noted that, since the coils obtain their current without the use of a power supply, some embodiments of system 100 and apparatus 200–500, 700 and 800 are implemented without the incorporation of superconducting correction coil switches and thereby avoid the expense and reliability issues associated thereof.

Apparatus 600 includes a superconducting correction coil switch 602 and resistor 604 wired in parallel. Apparatus 600 also includes inner windings 606 of a primary coil (not shown) and bucking coil windings 608 of the primary coil. In some embodiments, the resistor 604 is replaced by switch protection diodes which overcome time constant effects when setting a shim, but which have additional expense and reliability concerns with the switch protection diodes at cryogenic temperatures.

Figure 7:
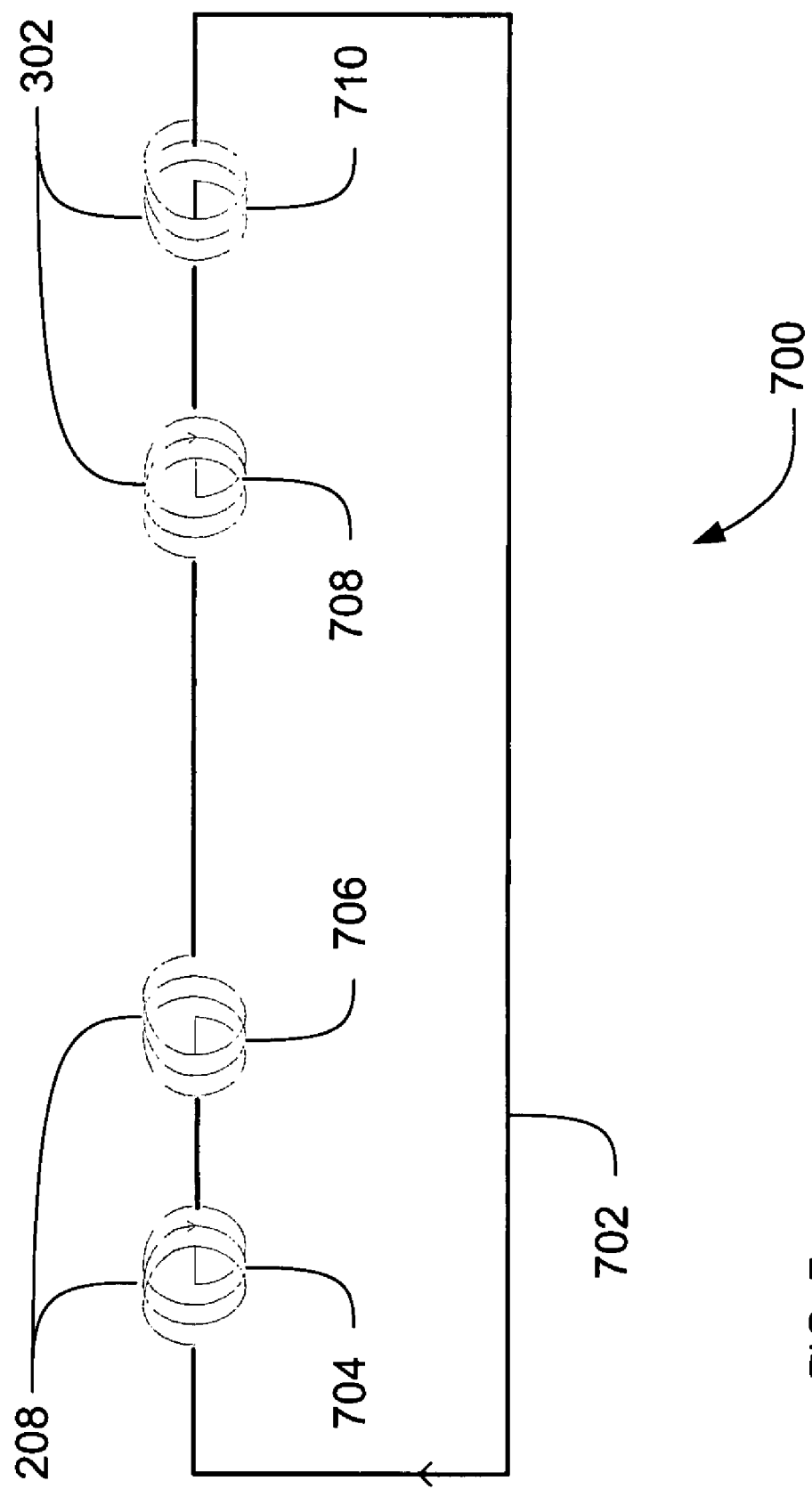
FIG. 7 is a diagram of an apparatus in which all mutually inductive secondary coils are wired as a single circuit.

FIG. 7 is a diagram of an apparatus 700 in which all mutually inductive Z1 secondary coils are wired as a single circuit. FIG. 7 shows the wiring of the Z1 secondary coil 208 and the other Z1 secondary coil 302 in FIG. 5. In FIG. 7, the Z1 secondary coil 208 and the other Z1 secondary coil 302 are wired as a single circuit 702. In apparatus 700, the Z1 secondary coil 208 is an outer Z1 correction coil that acts primarily as a flux antennae. In apparatus 700, the other Z1 secondary coil 302 is an inner Z1 correction coil that provides primarily homogeneity correction.

The Z1 secondary coil 208 includes windings 704 that has +ve turns and windings 706 that has −ve turns. The other Z1 secondary coil 302 includes windings 708 that has +ve turns and windings 710 that has −ve windings.

Figure 8:
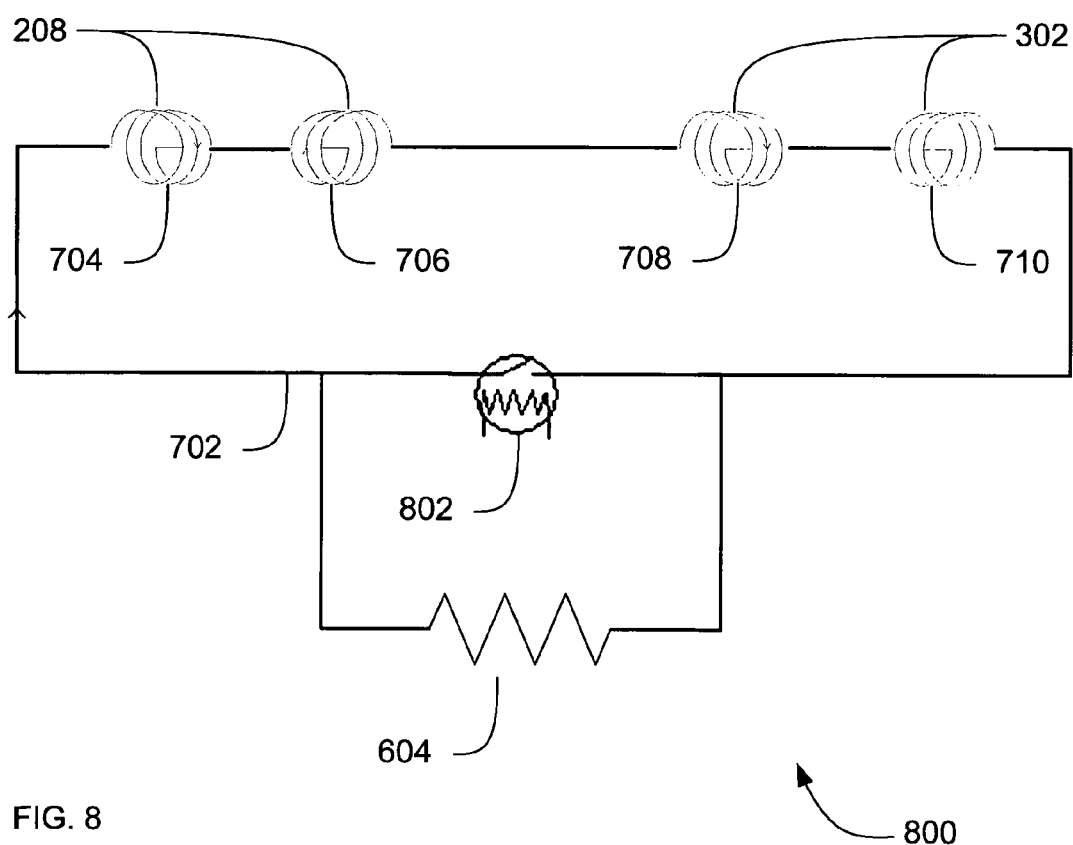
FIG. 8 is a diagram of an apparatus in which all mutually inductive secondary coils are wired as a single circuit having a superconducting switch.

FIG. 8 is a diagram of an apparatus 800 in which all mutually inductive secondary coils are wired as a single circuit having a superconducting switch 802.

Method Embodiments

In the previous section, apparatus of the operation of an embodiment was described. In this section, the particular methods performed by a processor of a magnetic resonance imaging (MRI) system and a human, of such an embodiment are described by reference to a series of flowcharts.

Figure 9:
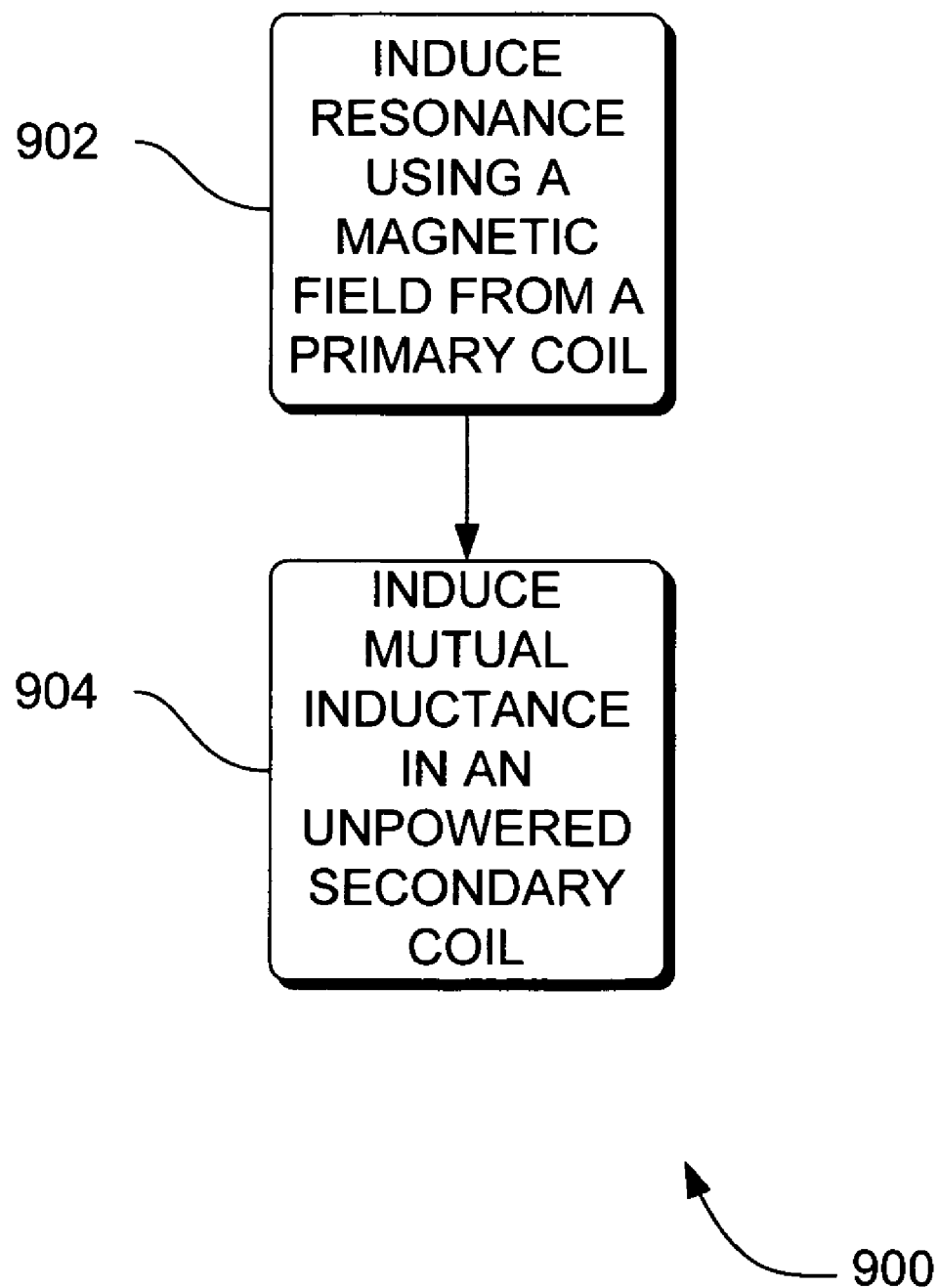
FIG. 9 is a flowchart of a method to increase homogeneity of a magnetic field according to an embodiment.

FIG. 9 is a flowchart of a method 900 to increase homogeneity of a magnetic field according to an embodiment.

Method 900 includes inducing 902 resonance using a magnetic field from a primary coil. Thereafter, electromagnetic mutual inductance is induced 904 in a Z1 secondary coil. The Z1 secondary coil is unpowered or unenergized. The current in the Z1 secondary coil is largely received through electromagnetic mutual inductance from the primary coil, although a small amount of inductance may occur from other electrical devices in the vicinity of the MRI system. The electromagnetic mutual inductance in the Z1 secondary coil from the primary coil reduces the inhomogeneity of the magnetic field.

During energization of the primary coil, the Z1 secondary coil(s) configured according to the system 100, apparatus 200–500, 700 and 800 and method 900 reduce inhomogeneity from the primary coil to some extent. When the primary coil is fully energized, the homogeneity is analyzed by taking a map of the magnetic field of view. Subsequent shim iterations with, for example, passive shims could then be implemented to achieve a required extent of homogeneity for satisfactory imaging performance. The amount of homogeneity correction required during these iterations would be small compared to a conventional solely passive shimmed magnet without the incorporation of this invention.

Figure 10:
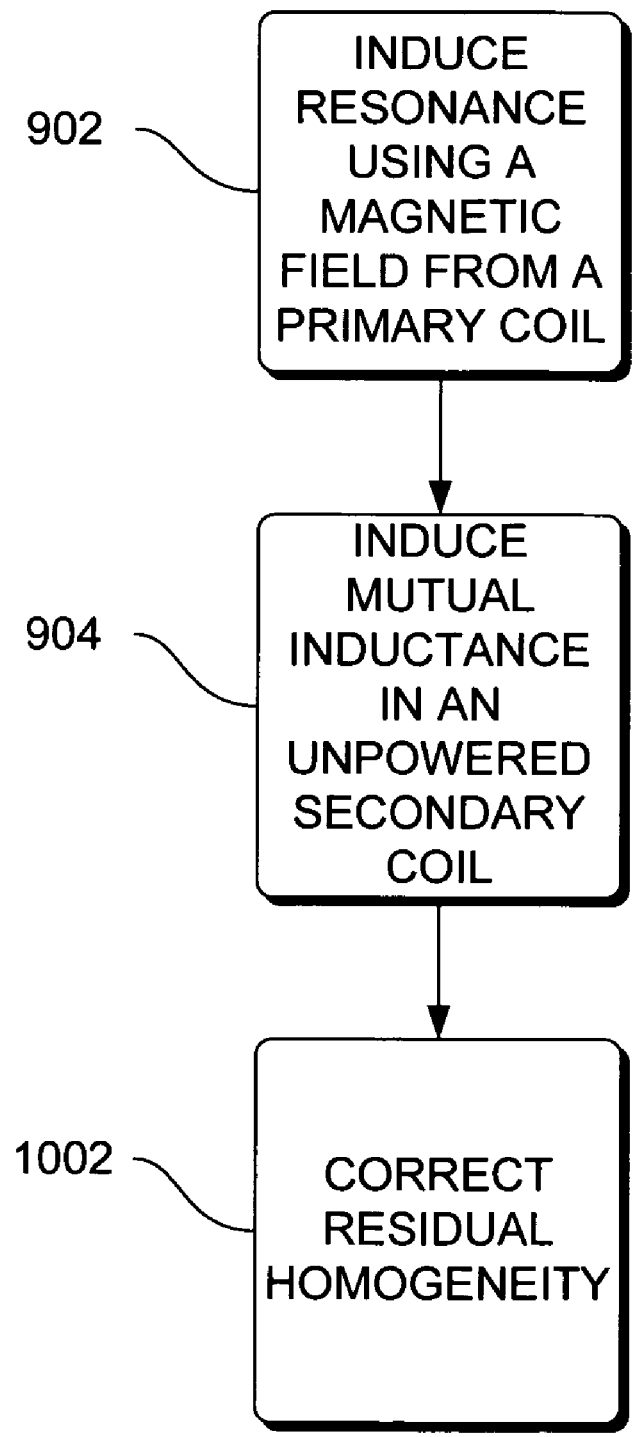
FIG. 10 is a flowchart of a method to increase homogeneity of a magnetic field system according to an embodiment.

FIG. 10 is a flowchart of a method 1000 to increase homogeneity of a magnetic field according to an embodiment. Method 1000 includes inducing 902 resonance using a magnetic field from a primary coil and inducing 904 electromagnetic mutual inductance in a Z1 secondary coil.

Thereafter, method 1000 includes correcting 1002 residual homogeneity by adding, removing or modifying a passive and/or room temperature shim current in order to reduce the extent of inhomogeneity in the MRI system. The correcting 1002 is performed by a human.

CONCLUSION

A magnetic resonance imaging system that generates a magnetic field of a reduced amount of inhomogeneity is described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations. For example, although described in procedural terms, one of ordinary skill in the art will appreciate that implementations can be made in an object-oriented design environment or any other design environment that provides the required relationships.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future communication devices, different file systems, and new data types.

The terminology used in this application with respect to magnetic resonance imaging systems, primary coils and Z1 secondary coils is meant to include all alternate technologies which provide the same functionality as described herein.

I claim:

1. A magnetic resonance imaging system to increase homogeneity in a magnetic field, the magnetic resonance imaging system comprising:
   a primary coil operable to generate the magnetic field; and
   a secondary coil positioned in relation to the primary coil to induce electromagnetic mutual inductance with the primary coil to the extent that homogeneity in the magnetic field is increased, wherein the secondary coil is not coupled to a power supply, wherein the secondary coil is operable to accumulate current via electromagnetic mutual inductance as the primary coil is energized, wherein the secondary coil is energized by the electromagnetic mutual inductance with the primary coil, and wherein the secondary coil is positioned outside a radius of the primary coil.

2. The magnetic resonance imaging system of claim 1, wherein the magnetic resonance imaging system further comprises:
   a medical magnetic resonance imaging system.

3. The magnetic resonance imaging system of claim 1 further comprising:
   another secondary coil being positioned within a radius of the primary coil.

4. The magnetic resonance imaging system of claim 3 further comprising:
   the secondary coil and the other secondary coil being wired together in a single circuit.

5. The magnetic resonance imaging system of claim 1 further comprising:
   another secondary coil being positioned outside a radius of the primary coil.

6. The magnetic resonance imaging system of claim 5 further comprising:
   the secondary coil and the other secondary coil being wired together in a single circuit.

7. The magnetic resonance imaging system of claim 5, wherein the other secondary coil further comprises:
   a Z1 secondary coil.

8. The magnetic resonance imaging system of claim 1, wherein the secondary coil further comprises:
   a Z1 secondary coil.

9. The magnetic resonance imaging system of claim 1, wherein the primary coil further comprises:
   a nuclear magnetic resonance spectrometer.

10. The magnetic resonance imaging system of claim 1, wherein the primary coil further comprises:
    a Fourier transform mass spectrometer.

11. The magnetic resonance imaging system of claim 1 further comprising:
    a superconducting correction coil switch; and a resistor wired in parallel with the superconducting correction coil switch.

12. A magnetic resonance imaging system to increase homogeneity in a magnetic field, the magnetic resonance imaging system comprising:

a primary coil operable to generate the magnetic field;

a secondary coil positioned in relation to the primary coil to induce electromagnetic mutual inductance with the primary coil to the extent that homogeneity in the magnetic field is increased, wherein the secondary coil is not coupled to a power supply, wherein the secondary coil is operable to accumulate current via electromagnetic mutual inductance as the primary coil is energized, wherein the secondary coil is energized by the electromagnetic mutual inductance with the primary coil and wherein the secondary coil is positioned within a radius of the primary coil; and another secondary coil positioned outside the radius of the primary coil.

13. The magnetic resonance imaging system of claim 12, wherein the magnetic resonance imaging system further comprises:

a medical magnetic resonance imaging system.

14. The magnetic resonance imaging system of claim 12, wherein the magnetic resonance imaging system further comprises:

the secondary coil and the other secondary coil being wired together in a single circuit.

15. The magnetic resonance imaging system of claim 12, wherein the secondary coil further comprises:

a Z1 secondary coil.

16. The magnetic resonance imaging system of claim 12, wherein the primary coil further comprises:

a nuclear magnetic resonance spectrometer.

17. The magnetic resonance imaging system of claim 12, wherein the primary coil further comprises:

a Fourier transform mass spectrometer.

18. The magnetic resonance imaging system of claim 12 further comprising:

a superconducting correction coil switch; and a resistor wired in parallel with the superconducting correction coil switch.

19. A method to reduce inhomogeneity in the magnetic field of an apparatus, the method comprising:

inducing resonance in a subject using a magnetic field from a primary coil of the apparatus; and inducing electromagnetic mutual inductance in a secondary coil of the apparatus as the primary coil is energized to the extent that homogeneity in the magnetic field is increased, wherein the secondary coil is not coupled to a power supply, wherein the secondary coil is positioned outside a radius of the primary coil.

20. The method of claim 19, wherein the method further comprises:

correcting residual inhomogeneity in the magnetic field.

21. The method of claim 19, wherein the apparatus further comprises:

a medical magnetic resonance imaging system.

* * * * *